(12) United States Patent
Yoo et al.

(10) Patent No.: US 10,804,295 B2
(45) Date of Patent: Oct. 13, 2020

(54) FERROELECTRIC MEMORY DEVICE

(71) Applicant: SK hynix Inc., Icheon-si (KR)

(72) Inventors: Hyangkeun Yoo, Icheon-si (KR); Yong Soo Choi, Seongnam-si (KR)

(73) Assignee: SK HYNIX INC., Icheon-si (KR)

( * ) Notice: Subject to any disclaimer, the term of this patent is extended or adjusted under 35 U.S.C. 154(b) by 4 days.

(21) Appl. No.: 16/179,031

(22) Filed: Nov. 2, 2018

(65) Prior Publication Data
US 2019/0287980 A1 Sep. 19, 2019

(30) Foreign Application Priority Data
Mar. 16, 2018 (KR) .......... 10-2018-0031165

(51) Int. Cl.
*H01L 27/1159* (2017.01)
*G11C 11/22* (2006.01)

(52) U.S. Cl.
CPC ........ *H01L 27/1159* (2013.01); *G11C 11/223* (2013.01)

(58) Field of Classification Search
CPC ............. H01L 29/517; H01L 29/516; H01L 29/40111; H01L 29/6684; G11C 11/22; G11C 11/223
USPC .............................. 257/295; 438/3; 365/145
See application file for complete search history.

(56) References Cited

U.S. PATENT DOCUMENTS

| | | | |
|---|---|---|---|
| 6,356,475 B1 * | 3/2002 | Tamura | G11C 11/22 365/145 |
| 6,611,450 B2 | 8/2003 | Oowaki et al. | |
| 2006/0081901 A1 * | 4/2006 | Arimoto | G11C 11/22 257/295 |
| 2014/0153340 A1 * | 6/2014 | Baek | G11C 11/5635 365/185.22 |
| 2015/0179657 A1 * | 6/2015 | Inumiya | H01L 29/516 257/295 |
| 2015/0221559 A1 * | 8/2015 | Kang | H01L 21/823842 257/369 |

FOREIGN PATENT DOCUMENTS

KR 20020014226 A 2/2002

* cited by examiner

*Primary Examiner* — Jonathan Han

(57) ABSTRACT

In an embodiment, a ferroelectric memory device includes a semiconductor substrate, a first ferroelectric memory cell transistor of NMOS type disposed in a first region of the semiconductor substrate, and a second ferroelectric memory cell transistor of PMOS type disposed in a second region adjacent to the first region of the semiconductor substrate. A first gate electrode layer of the first ferroelectric memory cell transistor and a second gate electrode layer of the second ferroelectric memory cell transistor are electrically connected to each other.

18 Claims, 13 Drawing Sheets

FERROELECTRIC MEMORY DEVICE

CROSS-REFERENCE TO RELATED APPLICATION

The present application claims priority under 35 U.S.C. 119(a) to Korean Patent Application No. 10-2018-0031165, filed on Mar. 16, 2018, which is herein incorporated by reference in its entirety.

BACKGROUND

1. Technical Field

Various embodiments of the present disclosure generally relate to a semiconductor device, and more particularly, relate to a ferroelectric memory device.

2. Related Art

Generally, a ferroelectric material refers to a material having spontaneous electrical polarization in a state in which no external electric field is applied. In addition, the ferroelectric material can be controlled to maintain one of two stable remanent polarization states on a ferroelectricity hysteresis curve. Such characteristics can be utilized in memory devices to store logic information of "0" or "1" in a nonvolatile manner.

Meanwhile, since the remanent polarization can be switched by applying an external electric field, studies regarding the application of ferroelectric materials to nonvolatile memory devices have been actively conducted. As an application example, in a cell structure having a single transistor, a nonvolatile memory device can use a ferroelectric material in a gate dielectric layer of the transistor. In the nonvolatile memory device, different signal information can be stored by applying a bias to the ferroelectric layer through the gate electrode layer and switching the polarization direction inside the ferroelectric layer.

SUMMARY

There is disclosed a ferroelectric memory device according to one aspect of the present disclosure. The ferroelectric memory device includes a semiconductor substrate, a first ferroelectric memory cell transistor of NMOS type disposed in a first region of the semiconductor substrate, and a second ferroelectric memory cell transistor of PMOS type disposed in a second region adjacent to the first region of the semiconductor substrate. A first gate electrode layer of the first ferroelectric memory cell transistor and a second gate electrode layer of the second ferroelectric memory cell transistor are electrically connected to each other.

There is disclosed a ferroelectric memory device according to another aspect of the present disclosure. The ferroelectric memory device includes a first ferroelectric memory cell transistor of NMOS type connected to a first bit line and a first source line, and a second ferroelectric memory cell transistor of PMOS type connected to a second bit line and a second source line. The first and second ferroelectric memory cell transistors are disposed adjacent to each other and share a word line.

DETAILED DESCRIPTION

Figure 1A:
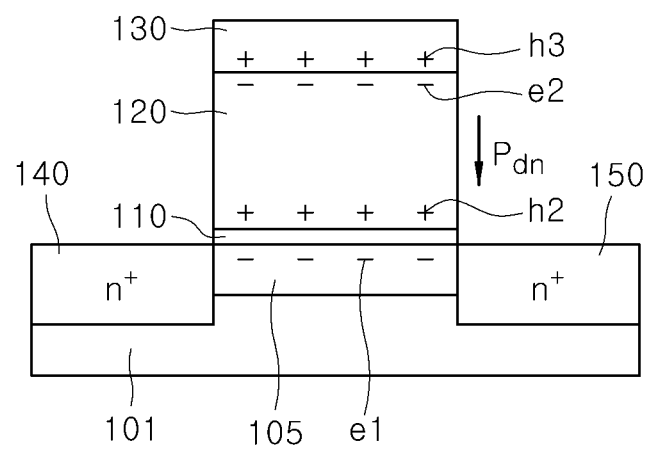
FIGS. 1A and 1B are cross-sectional views schematically illustrating an operation of a ferroelectric memory cell transistor according to an embodiment of the present disclosure.

Various embodiments will now be described hereinafter with reference to the accompanying drawings. In the drawings, the dimensions of layers and regions may be exaggerated for clarity of illustration. The drawings are described with respect to an observer's viewpoint. If an element is referred to be located on another element, it may be understood that the element is directly located on the other element, or an additional element may be interposed between the element and the other element. The same reference numerals refer to the same elements throughout the specification.

In addition, expression of a singular form of a word should be understood to include the plural forms of the word unless clearly used otherwise in the context. It will be understood that the terms "comprise", "include" or "have" are intended to specify the presence of a feature, a number, a step, an operation, an element, a part, or combinations thereof, but not used to preclude the presence or possibility of additional one or more other features, numbers, steps, operations, components, parts, or combinations thereof. Further, in performing a method or a manufacturing method, each process constituting the method can take place differently from the stipulated order unless a specific sequence is described explicitly in the context. In other words, each process may be performed in the same manner as stated order, may be performed substantially at the same time, or may be performed in a reverse order.

In this specification, a programming operation or an erasing operation of a ferroelectric memory device may mean an operation of changing the orientation of remanent polarization of a ferroelectric layer. By changing the orientation of the remanent polarization, an electrical resistance measured in a channel region between a source region and a drain region may vary during a read operation of the ferroelectric memory device. That is, the signal information written by the programming operation or the erasing operation may be stored in the ferroelectric layer, and the signal information can be read using the change in electrical resistance in the channel region.

In this specification, an NMOS type transistor may mean a device configured so that electrons are conducted through a channel layer of the transistor when the transistor is turned on. On the other hand, a PMOS type transistor may mean a device configured so that holes are conducted through a channel layer of the transistor when the transistor is turned on.

Figure 1B:
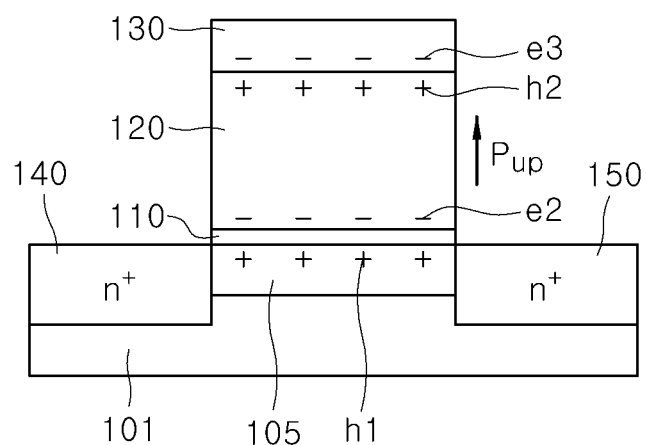

FIGS. 1A and 1B are cross-sectional views schematically illustrating an operation of a ferroelectric memory cell transistor 10 according to an embodiment of the present disclosure. Referring to FIGS. 1A and 1B, the ferroelectric memory cell transistor 10 may include a semiconductor substrate 101, a ferroelectric layer 120 and a gate electrode layer 130. A source region 140 and a drain region 150 may be disposed in the semiconductor substrate 101 at both ends of the gate electrode layer 130. An interfacial insulation layer 110 may be disposed between the semiconductor substrate 101 and the ferroelectric layer 120.

The ferroelectric memory cell transistor 10 may be an NMOS type transistor or a PMOS type transistor. Hereinafter, for convenience of description, the NMOS type transistor will be described. However, the present disclosure is not limited thereto, and substantially the same operation methods can be applied to the PMOS type transistor. However, there is a difference in that the carrier conducting the channel layer is a hole in the case of the PMOS type transistor, while the carrier conducting the channel layer is an electron in the case of the NMOS type transistor. In addition, the PMOS type transistor and the NMOS type transistor may have opposite doping types with respect to the substrate 101, the source region 140, and the drain region 150.

Referring to FIGS. 1A and 1B, the semiconductor substrate 101 may include, for example, a semiconductor material such as silicon (Si), germanium (Ge), silicon germanium (SiGe), gallium arsenide (GaAs) and the like. The semiconductor substrate 101 may, for example, be a silicon (Si) substrate doped into a p-type substrate. The source region 140 and the drain region 150 may, for example, be regions of a silicon (Si) substrate, which are doped with n-type dopants.

The interfacial insulation layer 110 may be disposed on the semiconductor substrate 101. The interfacial insulation layer 110 may include, for example, silicon oxide, silicon nitride, silicon oxynitride or a combination thereof. The ferroelectric layer 120 may be disposed on the interfacial insulation layer 110. The ferroelectric layer 120 may include a ferroelectric material. The ferroelectric material may include, for example, hafnium oxide ($HfO_2$), zirconium oxide ($ZrO_2$), hafnium zirconium oxide ($Hf_{0.5}Zr_{0.5}O_2$), or a combination of two or more thereof. The ferroelectric layer 120 may include a dopant distributed in the ferroelectric material. The dopant may include carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), gadolinium (Gd), lanthanum (La), or a combination of two or more thereof.

The interfacial insulation layer 110 can prevent direct contact between the semiconductor substrate 101 and the ferroelectric layer 120. The interfacial insulation layer 110 can prevent crystal defects generated at an interface between the semiconductor substrate 101 and the ferroelectric layer 120 if the semiconductor substrate 101 and the ferroelectric layer 120 are in direct contact with each other. The interfacial insulation layer 110 may include an amorphous insulating material. The insulating material may include, for example, silicon oxide, silicon nitride, silicon oxynitride, or a combination thereof.

The gate electrode layer 130 may be disposed on the ferroelectric layer 120. The gate electrode layer 130 may include a conductive material. The conductive material may include, for example, tungsten (W), titanium (Ti), copper (Cu), aluminum (Al), ruthenium (Ru), platinum (Pt), iridium (Ir), iridium oxide ($IrO_2$), tungsten nitride (WN), titanium nitride (TiN), tantalum nitride (TaN), tungsten carbide (WC), titanium carbide (TiC), tungsten silicide ($WSi_2$), titanium silicide ($TiSi_2$), tantalum silicide ($TaSi_2$), ruthenium oxide ($RuO_2$), or a combination of two or more thereof.

Meanwhile, a channel region 105 may be disposed between the source region 140 and the drain region 150. The channel region 105 may be a region of the semiconductor substrate 101 located below the ferroelectric layer 120. When a density of the charge induced in the channel region 105 is increased to a predetermined threshold value or more, a conductive channel layer can be formed in the channel region 105. The density of the charge can be determined or affected by a remanent polarization orientation of the ferroelectric layer 120, a magnitude of the remanent polarization, a polarity of a voltage applied to the gate electrode layer 130, a magnitude of the voltage and the like. In FIGS. 1A and 1B, positive and negative charges induced in the channel region 105 are denoted by h1 and e1, respectively. In addition, positive and negative charges formed in the ferroelectric layer 120 are denoted by h2 and e2, respectively, and positive and negative charges induced in the gate electrode layer 130 are denoted by h3 and e3, respectively.

Referring to FIG. 1A, a first write voltage may be applied to the gate electrode layer 130 to write a first remanent polarization having a first polarization orientation $P_{dn}$ in the ferroelectric layer 120. As an example, the first write voltage may be applied by applying a bias having a relatively high potential in comparison with the potentials of the semiconductor substrate 101, the source region 140 and the drain region 150 to the gate electrode layer 130.

Under the influence of the first remanent polarization, negative charges e2 may be distributed or arranged in an inner region of the ferroelectric layer 120 at or near the contact with the gate electrode layer 130, and positive charges h2 may be distributed or arranged in an inner region of the ferroelectric layer 120 at or near the contact with the interfacial insulation layer 110. In addition, the first remanent polarization can induce negative charges e1 in the channel region 105, which is in contact with the interfacial insulation layer 110, and can induce positive charges h3 in an inner region of the gate electrode layer 130 at or near the contact with the ferroelectric layer 120.

Referring to FIG. 1B, a second write voltage may be applied to the gate electrode layer 130 to write a second remanent polarization having a second polarization orientation $P_{up}$ in the ferroelectric layer 120. As an example, the second write voltage may be applied by applying a bias having a relatively low potential in comparison with the potentials of the semiconductor substrate 101, the source region 140 and the drain region 150 to the gate electrode layer 130.

Under the influence of the second remanent polarization, positive charges h2 may be distributed or arranged in an inner region of the ferroelectric layer 120 at or near the contact with the gate electrode layer 130, and negative charges e2 may be distributed or arranged in an inner region of the ferroelectric layer 120 at or near the contact with the interfacial insulation layer 110. In addition, the second remanent polarization can induce positive charges h1 in the channel region 105, which is in contact with the interfacial insulation layer 110, and can induce negative charges e3 in an inner region of the gate electrode layer 130 at or near the contact with the ferroelectric layer 120.

In FIG. 1A, a state in which the first remanent polarization having the first polarization orientation $P_{dn}$ is stored in the ferroelectric layer 120 may be designated as a signal information of '1', and in FIG. 1B, a state in which the second remanent polarization having the second polarization orientation $P_{up}$ is stored in the ferroelectric layer 120 may be designated as a signal information of '0'. Alternatively, a state in which the second remanent polarization with orientation $P_{up}$ is stored in the ferroelectric layer 120 may be designated as signal information of '1', and a state in which the first remanent polarization with orientation $P_{dn}$ is stored in the ferroelectric layer 120 may be designated as signal information of '0'. In addition, the first and second write voltages may be alternately applied to the gate electrode layer 130, so that the remanent polarization of the ferroelectric layer 120 can be switched between the first and second remanent polarizations.

Figure 2A:
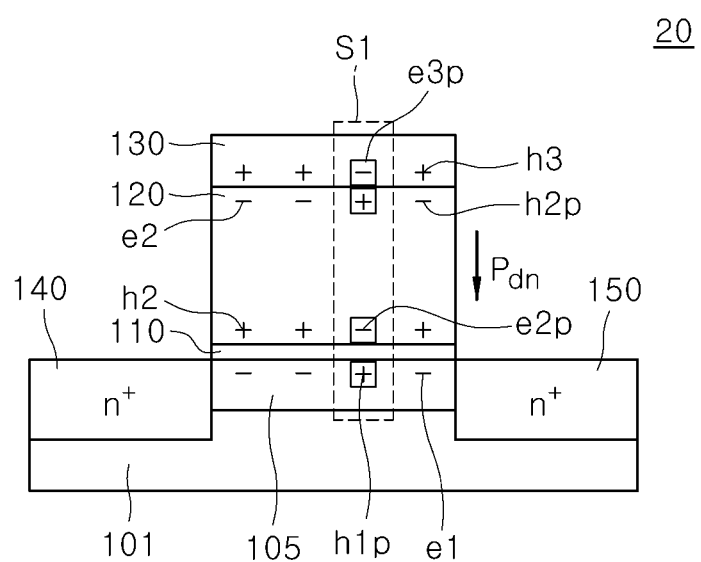
FIGS. 2A and 2B are views schematically illustrating charge pinning of a ferroelectric memory cell transistor in an embodiment of the present disclosure.
Figure 2B:
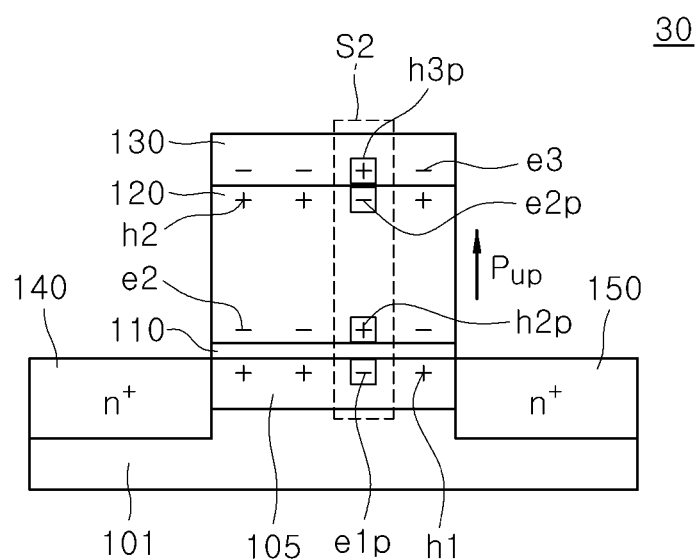
Figure 3:
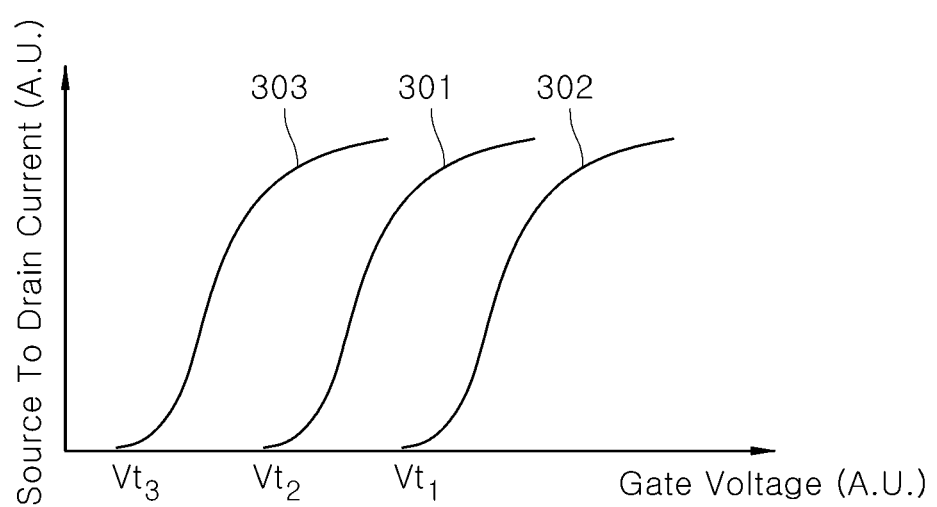
FIG. 3 is a view schematically illustrating a threshold voltage variation in a read operation of a ferroelectric memory cell transistor in an embodiment of the present disclosure.

FIGS. 2A and 2B are views schematically illustrating charge pinning of a ferroelectric memory cell transistor in an embodiment of the present disclosure. FIG. 3 is a view schematically illustrating a threshold voltage variation in a read operation of a ferroelectric memory cell transistor in an embodiment of the present disclosure. Configurations of ferroelectric memory cell transistors 20 and 30 of FIGS. 2A and 2B may be substantially the same as a configuration of the NMOS type ferroelectric memory cell transistor 10 of FIG. 1A. Although, for convenience of description, the NMOS type ferroelectric memory cell transistors 20 and 30 will be described hereinafter, the PMOS type transistor may be also applicable as the ferroelectric memory cell transistors 20 and 30.

In the ferroelectric memory cell transistors 20 and 30, when first and second write operations are repeatedly and alternately performed, switching between the first polarization orientation $P_{dn}$ and the second polarization orientation $P_{up}$ in the ferroelectric layer 120 is also repeated. Depending on nature of the repetitive write operations, some of the charges inside the ferroelectric layer 120 can remain unswitched even when the polarity and magnitude of the applied voltage should be sufficient to result in switching. Such charges can remain fixed in ferroelectric layer 120 with respect to orientation during repetitive write operations, attracting opposite charges in channel region 105 and gate electrode layer 130.

In an embodiment, referring to region S1 of FIG. 2A, in the polarization switching, some negative fixed or pinned charges e2p are formed in an inner region of the ferroelectric layer 120 at or near the contact with the interfacial insulation layer 110 and some positive fixed or pinned charges h2p are formed in an inner region of the ferroelectric layer 120 at or near the contact with the gate electrode layer 130. In addition, some fixed or pinned charges h1p and e3p may be formed in the channel region 105 and the gate electrode layer 130, respectively. Fixed or pinned charges h1p and e3p may result from, and generally correspond to, the fixed or pinned charges h2p and e2p formed in the ferroelectric layer 120. When the fixed and pinned charges h1p having positive charge are formed in the channel layer 105, in an NMOS type transistor, a read voltage applied to the gate electrode layer 130 for performing the read operation may need to be increased compared to that needed in a transistor where h1p has a negative charge.

Referring to FIG. 3, a first graph 301 shows a source-drain current according to a gate voltage in a case in which no fixed or pinned charge is formed in the channel region 105 of the ferroelectric memory cell transistor 20 (e.g., when h1p in FIG. 2A has a negative charge). When the gate voltage is increased to a predetermined threshold voltage $Vt_1$ or higher, electrons induced in the channel region 105 form a channel layer, and accordingly a source-drain current flows between the source region and the drain region. Meanwhile, a second graph 302 shows a source-drain current according to a gate voltage in a case in which a positive fixed or pinned charge h1p is formed in the channel region 105 of the ferroelectric memory cell transistor 20. Referring to FIG. 2A, in a case in which some positive fixed or pinned charges h1p are formed in the channel region 105, it is necessary to overcome the positive fixed or pinned charges h1p to induce electrons to form a channel layer of the electrons in the channel region 105. That is, it is necessary to increase the magnitude of the read voltage applied to the gate electrode layer 130 to relatively increase the density of the electrons induced in the channel region 105. Accordingly, the threshold voltage $Vt_2$ of the gate voltage for forming the channel layer in the second graph 302 of FIG. 3 may be higher than the threshold voltage $Vt_1$ of the gate voltage for forming the channel layer in the first graph 301.

In another embodiment, referring to region S2 of FIG. 2B, in the polarization switching process, some positive fixed or pinned charges h2p may be formed in an inner region of the ferroelectric layer 120 at or near the contact with the interfacial insulation layer 110, and some negative fixed or pinned charges e2p may be formed in an inner region of the ferroelectric layer 120 at or near the contact with the gate electrode layer 130. In addition, fixed or pinned charges e1p and h3p may be formed in the channel region 105 and the gate electrode layer 130, respectively. Fixed or pinned charges e1p and h3p result from, and generally correspond to, the fixed or pinned charges h2p and e2p formed in the ferroelectric layer 120. When the fixed or pinned charge e1p having a negative charge is formed in the channel region 105, the magnitude of the read voltage applied to the gate electrode layer 130 to perform the read operation in NMOS type transistor is reduced compared to that needed in a transistor where e1p has a positive charge.

Referring to FIG. 3, a third graph 303 shows a source-drain current according to a gate voltage in a case in which a negative fixed charge e1p is formed in the channel region 105 of the ferroelectric memory cell transistor 30. As in FIG. 2B, when negative fixed or pinned charges e1p are formed in the channel region 105, the density of electrons to be induced in the channel region 105 may be reduced in forming an electron channel layer in the channel region 105. That is, the read voltage applied to the gate electrode layer 130 may be decreased in order to form the channel layer. Accordingly, in the third graph 303 of FIG. 3, a threshold voltage $Vt_3$ of the gate voltage for forming the channel layer may be lower than the threshold voltage $Vt_1$ of the gate voltage for forming the channel layer in the first graph 301 of FIG. 3.

As described above, the threshold voltage of a read voltage may vary depending on the type of the fixed or pinned charge formed in the ferroelectric layer 120, which in turn induces fixed charges in channel region 105. In a case in which the ferroelectric memory device includes a plurality of memory cell transistors, the fixed or pinned charges may cause a deviation of the threshold voltage among the plurality of memory cell transistors, thereby lowering the reliability of the read operations. In the same way, the fixed or pinned charges may cause a threshold voltage deviation of the write voltage among the memory cell transistors, thereby lowering the reliability of the write operations.

Figure 4:
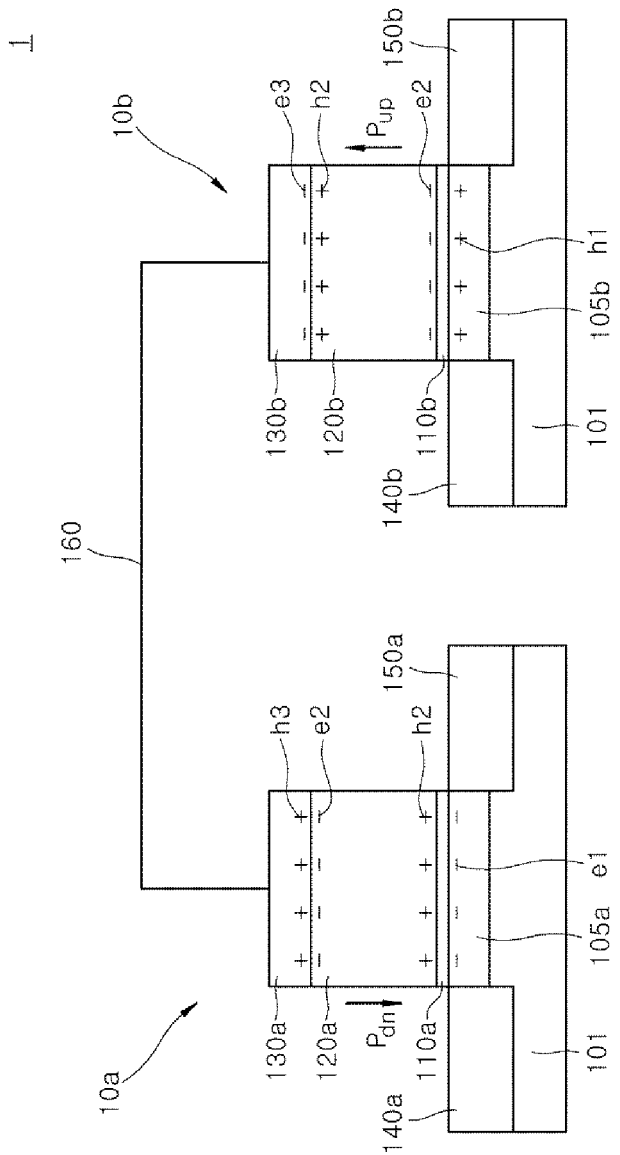
FIG. 4 is a view schematically illustrating a ferroelectric memory device according to a comparative example of the present disclosure.

FIG. 4 is a view schematically illustrating a ferroelectric memory device 1 according to a comparative example of the present disclosure. Referring to FIG. 4, the ferroelectric memory device 1 includes first and second ferroelectric memory cell transistors 10a and 10b. The first and second ferroelectric memory cell transistors 10a and 10b may be transistors of the same type. As an example, each of the first and second ferroelectric memory cell transistors 10a and 10b may be an NMOS type transistor. As another example, each of the first and second ferroelectric memory cell transistors 10a and 10b may be a PMOS type transistor. In an embodiment, although FIG. 4 illustrates a case in which the first and second ferroelectric memory cell transistors 10a and 10b are each NMOS type transistors, FIG. 4 is not limited thereto. For example, substantially the same configuration can be used even when the first and second ferroelectric memory cell transistors 10a and 10b are PMOS type transistors.

The first and second ferroelectric memory cell transistors 10a and 10b include a p-type doped semiconductor substrate 101, first and second source regions 140a and 140b doped into n-type regions, and first and second drain regions 150a and 150b doped into n-type regions, respectively. The first and second ferroelectric memory cell transistors 10a and 10b include first and second interfacial insulation layers 110a and 110b, first and second ferroelectric layers 120a and 120b, and first and second gate electrode layers 130a and 130b that are sequentially disposed on the semiconductor substrate 101, respectively. First and second channel regions 105a and 105b are disposed in the semiconductor substrate 101 between the first and second source regions 140a and 140b and the first and second drain regions 150a and 150b, respectively.

Configurations of the first and second source regions 140a and 140b, the first and second drain regions 150a and 150b, the first and second channel regions 105a and 105b, the first and second interfacial insulation layers 110a and 110b, the first and second ferroelectric layers 120a and 120b, and the first and second gate electrode layers 130a and 130b may be substantially the same as those of the source region 140, the drain region 150, the channel region 105, the interfacial insulation layer 110, the ferroelectric layer 120, and the gate electrode layer 130 of the ferroelectric memory cell transistor 10 described above and with reference to FIGS. 1A and 1B.

In the first and second ferroelectric memory cell transistors 10a and 10b, the first and second gate electrode layers 130a and 130b may be electrically connected to each other through a conduction line 160. In addition, the first and second ferroelectric layers 120a and 120b of the first and second ferroelectric memory cell transistors 10a and 10b may be controlled to store different remanent polarization having different polarization orientations. Referring to FIG. 4, as an example, the first ferroelectric layer 120a of the first ferroelectric memory cell transistor 10a may have remanent polarization of a first polarization orientation $P_{dn}$, and the second ferroelectric layer 120b of the second ferroelectric memory cell transistor 10b may have remanent polarization of a second polarization orientation $P_{up}$. At this time, positive charges h3 induced in the first gate electrode layer 130a and negative charges e3 induced in the second gate electrode layer 130b may be compensated for through the conduction line 160. As a result, when polarization switching operations are repeated in the first and second ferroelectric memory cell transistors 10a and 10b, the charges can be inhibited from being fixed within the first and second ferroelectric layers 120a and 120b. Consequently, fluctuations in the threshold voltage due to the fixed or pinned charges in the first and second ferroelectric memory cell transistors 10a and 10b can be suppressed, thereby preventing a reduction in the reliability of the read operations and the write operations.

However, as described above, when the first and second ferroelectric memory cell transistors 10a and 10b are transistors of the same type, the remanent polarization having different polarization orientations can correspond to different signal information. That is, referring to FIG. 4, the first remanent polarization having the first polarization orientation $P_{dn}$ stored in the first ferroelectric layer 120a may correspond to a signal information of '1', and the second remanent polarization having the second polarization orientation $P_{up}$ stored in the second ferroelectric layer 120b may correspond to a signal information of '0'. Alternatively, the first remanent polarization having the first polarization orientation $P_{dn}$ stored in the first ferroelectric layer 120a may correspond to a signal information of '0', and the second remanent polarization having the second polarization orientation $P_{up}$ stored in the second ferroelectric layer 120b may correspond to a signal information of '1'.

In other words, in an embodiment in which a ferroelectric memory device includes an "n" number of ferroelectric memory cell transistors, n/2 ferroelectric memory cell transistors have to be controlled to store a signal of '1' and the remaining n/2 ferroelectric memory cell transistors have to be controlled to store a signal of '0' in order to prevent the above-described fixed or pinned charge generation. In order to prevent fixed or pinned charge generation, which is in derogation of the reliability of read and write operations, cases in which n ferroelectric memory cell transistors all store a signal of '1', and similarly, cases in which n ferroelectric memory cell transistors all store a signal of '0', cannot be implemented. As a result, such an operation method of a ferroelectric memory device 1 of FIG. 4 may lower the storage capacity or capabilities of a plurality of similar ferroelectric memory cell transistors.

Figure 5:
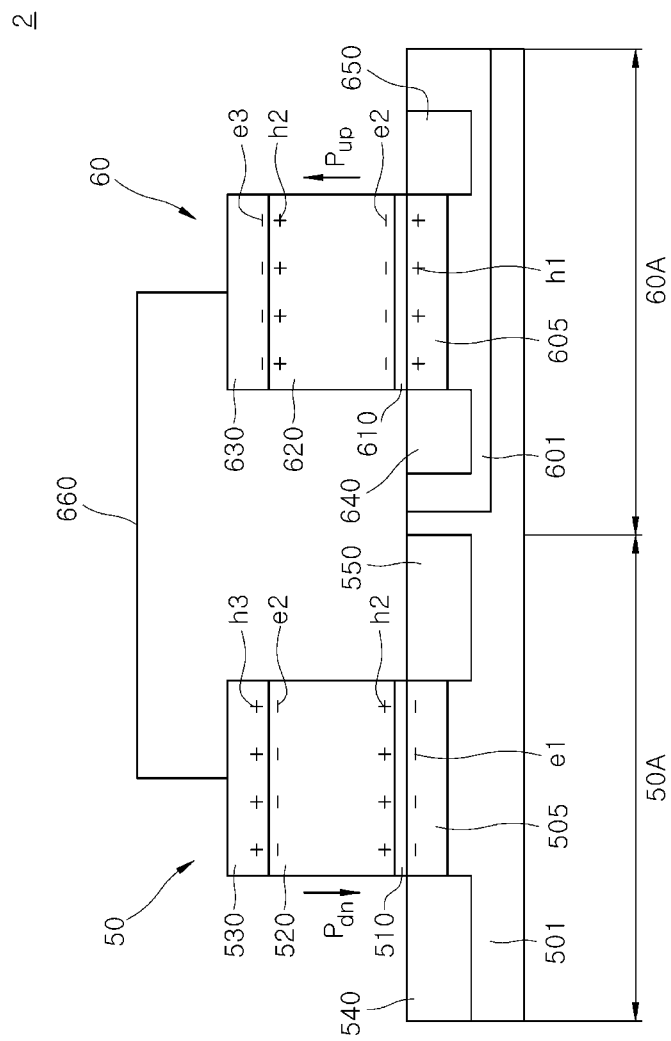
FIG. 5 is a view schematically illustrating a ferroelectric memory device according to an embodiment of the present disclosure.

FIG. 5 is a view schematically illustrating a ferroelectric memory device 2 according to an embodiment of the present disclosure. Referring to FIG. 5, the ferroelectric memory device 2 may have a first and second ferroelectric memory cell transistors 50 and 60 disposed on a semiconductor substrate 501. The first and second ferroelectric memory cell transistors 50 and 60 may be different types of transistors. As an example, when the first ferroelectric memory cell transistor 50 is an NMOS transistor, the second ferroelectric memory cell transistor 60 may be a PMOS transistor. As another example, when the first ferroelectric memory cell transistor 50 is a PMOS transistor, the second ferroelectric memory cell transistor 60 may be an NMOS transistor. Although it is illustrated that the first ferroelectric memory cell transistor 50 is an NMOS transistor and the second ferroelectric memory cell transistor 60 is a PMOS transistor, the present disclosure is not necessarily limited thereto.

Referring to FIG. 5, the semiconductor substrate 501 may include, for example, a semiconductor material such as silicon (Si), germanium (Ge), silicon germanium (SiGe), gallium arsenide (GaAs) and the like. The semiconductor substrate 501 may, for example, be a silicon (Si) substrate. The first ferroelectric memory cell transistor 50 of NMOS type may be disposed in a first region 50A of the semiconductor substrate 501. The second ferroelectric memory cell transistor 60 of PMOS type may be disposed in a second region 60A of the semiconductor substrate 501. In an embodiment, the first and second ferroelectric memory cell transistors 50 and 60 may be disposed to be adjacent to each other. The first and second ferroelectric memory cell transistors 50 and 60 may be electrically connected to each other through a conduction line 660. In some embodiments, the conduction line 660 may be a word line shared by the first and second ferroelectric memory cell transistors 50 and 60 in the ferroelectric memory device 2.

In an embodiment, the semiconductor substrate 501 may be a substrate doped into a p-type substrate. That is, the semiconductor substrate 501 may function as a first well 501 doped into p-type. The first region 50A of the semiconductor substrate 501 may include a first well 501, and a first source region 540 and a first drain region 550 disposed to be spaced apart from each other in the first well 501. The first source region 540 and the first drain region 550 may be doped into n-type regions. In some embodiments, the first well may be separately formed in a region of the semiconductor substrate in order to effectively control the doping concentration of the first well 501. In such a case, the semiconductor substrate may not be necessarily doped into p-type, but instead, the first well 501 may be formed by implanting a p-type dopant into the semiconductor substrate. As a method of implanting the dopant, an ion implantation method or a diffusion method can be applied.

The first ferroelectric memory cell transistor 50 may include a first interfacial insulation layer 510, a first ferroelectric layer 520 and a first gate electrode layer 530 that are sequentially disposed on the first well 501. A first channel region 505 may be disposed in the first well 501 between the first source region 540 and the first drain region 550. Configurations of the first source region 540, the first drain region 550, the first channel region 505, the first interfacial insulation layer 510, the first ferroelectric layer 520 and the first gate electrode layer 530 may be substantially the same as those of the source region 140, the drain region 150, the channel region 105, the interfacial insulation layer 110, the ferroelectric layer 120 and the gate electrode layer 130 of the ferroelectric memory cell transistor 10 described above and with reference to FIGS. 1A and 1B. Although not specifically shown in the figures, the first source region 540 and the first drain region 550 may be connected to a first source line and a first bit line of the ferroelectric memory device 2, respectively.

The second region 60A of the semiconductor substrate 501 may include a second well 601 doped into n-type, a second source region 640 and a second drain region 650 disposed to be spaced apart from each other in the second well 601. The second source region 640 and the second drain region 650 may be doped into p-type regions. In an embodiment, the second well 601 may be disposed to be surrounded by the first well 501. The second well 601 may be formed by implanting an n-type dopant into the first well 501. As a method of implanting the dopant may apply, for example, an ion implantation method or a diffusion method.

The second ferroelectric memory cell transistor 60 may include a second interfacial insulation layer 610, a second ferroelectric layer 620 and a second gate electrode layer 630 that are sequentially disposed on the second well 601. A second channel region 605 may be disposed in the second well 601 between the second source region 640 and the second drain region 650. Configurations of the second interfacial insulation layer 610, the second ferroelectric layer 620 and the second gate electrode layer 630 may be substantially the same as those of the first interfacial insulation layer 510, the first ferroelectric layer 520 and the first gate electrode layer 530 of the above-described ferroelectric memory cell transistor 50. Although not specifically shown in the figures, the second source region 640 and the second drain region 650 may be connected to a second source line and a second bit line of the ferroelectric memory device 2, respectively.

Referring again to FIG. 5, in the first and second ferroelectric memory cell transistors 50 and 60, the first and second gate electrode layers 530 and 630 may be electrically connected to each other through the conduction line 660. In addition, the first and second ferroelectric layers 520 and 620 of the first and second ferroelectric memory cell transistors 50 and 60 may be controlled to store remanent polarization having different polarization orientations. As illustrated in FIG. 5, as an example, the first ferroelectric layer 520 of the first ferroelectric memory cell transistor 50 may have remanent polarization of a first polarization orientation $P_{dn}$ and the second ferroelectric layer 620 of the second ferroelectric memory cell transistor 60 may have remanent polarization of a second polarization orientation $P_{up}$. At this time, positive charges h3 induced in the first gate electrode layer 530 and negative charges e3 induced in the second gate electrode layer 630 may be compensated for through the conduction line 660. As a result, when the polarization switching operation is repeated in the first and second ferroelectric memory cell transistors 50 and 60, the charges can be inhibited from being fixed within the first and second ferroelectric layers 520 and 620. As a result, fluctuations in the threshold voltage due to the fixed or pinned charges in the first and second ferroelectric memory cell transistors 50 and 60 can be suppressed, thereby preventing a reduction in the reliability of the read operation and the write operation.

Meanwhile, when the first and second ferroelectric memory cell transistors 50 and 60 are different types of transistors, the remanent polarization having different polarization orientations may correspond to the same signal information. Referring again to FIG. 5, in the first ferroelectric memory cell transistor 50, the first remanent polarization of the first polarization orientation $P_{dn}$ may induce electrons into the channel region 505 to assist in forming a channel layer. In the second ferroelectric memory cell transistor 60, the second remanent polarization of the second polarization orientation $P_{up}$ may induce holes into the channel region 605 to assist in forming a channel layer. In another embodiment not illustrated herein, in the first ferroelectric memory cell transistor 50, a second remanent polarization of the second polarization orientation $P_{up}$ may eject the electrons from the channel region 505 and interfere with the formation of the channel layer. In the second ferroelectric memory cell transistor 60, a first remanent polarization of the first polarization orientation $P_{dn}$ may eject the holes from the channel region 605 and interfere with the formation of the channel layer.

Thus, the first ferroelectric layer 520 having the first remanent polarization of the first polarization orientation $P_{dn}$ may store signal information of '1', and the second ferroelectric layer 620 having the second remanent polarization of the second remanent polarization $P_{up}$ may also store signal information of '1'. Alternatively, the first ferroelectric layer 520 having the second remanent polarization of the second polarization orientation $P_{up}$ may store signal information of '0', and the second ferroelectric layer 620 having the first remanent polarization of the first remanent polarization $P_{dn}$ may also store signal information of '0'. Thus, it is possible to control the first and second ferroelectric memory cell transistors 50 and 60 adjacent to each other to store the remanent polarization having different polarization orientations in order to prevent the above-described generation of the fixed charges.

In other words, in an embodiment in which a ferroelectric memory device includes an "n" number of ferroelectric memory cell transistors, in order to prevent the generation of the above-described fixed charges, n/2 NMOS type ferroelectric memory cell transistors and n/2 PMOS type ferroelectric memory cell transistors are provided, and a pair of NMOS type and PMOS type ferroelectric memory cell transistors, adjacent to each other, can be controlled to store the same signal information. That is, a pair of adjacent NMOS type and PMOS type ferroelectric memory cell transistors can be controlled to store signal information of '0' or store signal information of '1'. In this case, all n ferroelectric memory cell transistors in the ferroelectric memory device can store a signal information of '1', and all n ferroelectric memory cell transistors in the ferroelectric memory device can also store signal information of '0' in the alternative, without fixed charges degrading the read and write operations. The above-described operation methods of the ferroelectric memory device can improve the storage capabilities and characteristics of a plurality of ferroelectric memory cell transistors as compared with the ferroelectric memory device shown in FIG. 4.

Figure 6:
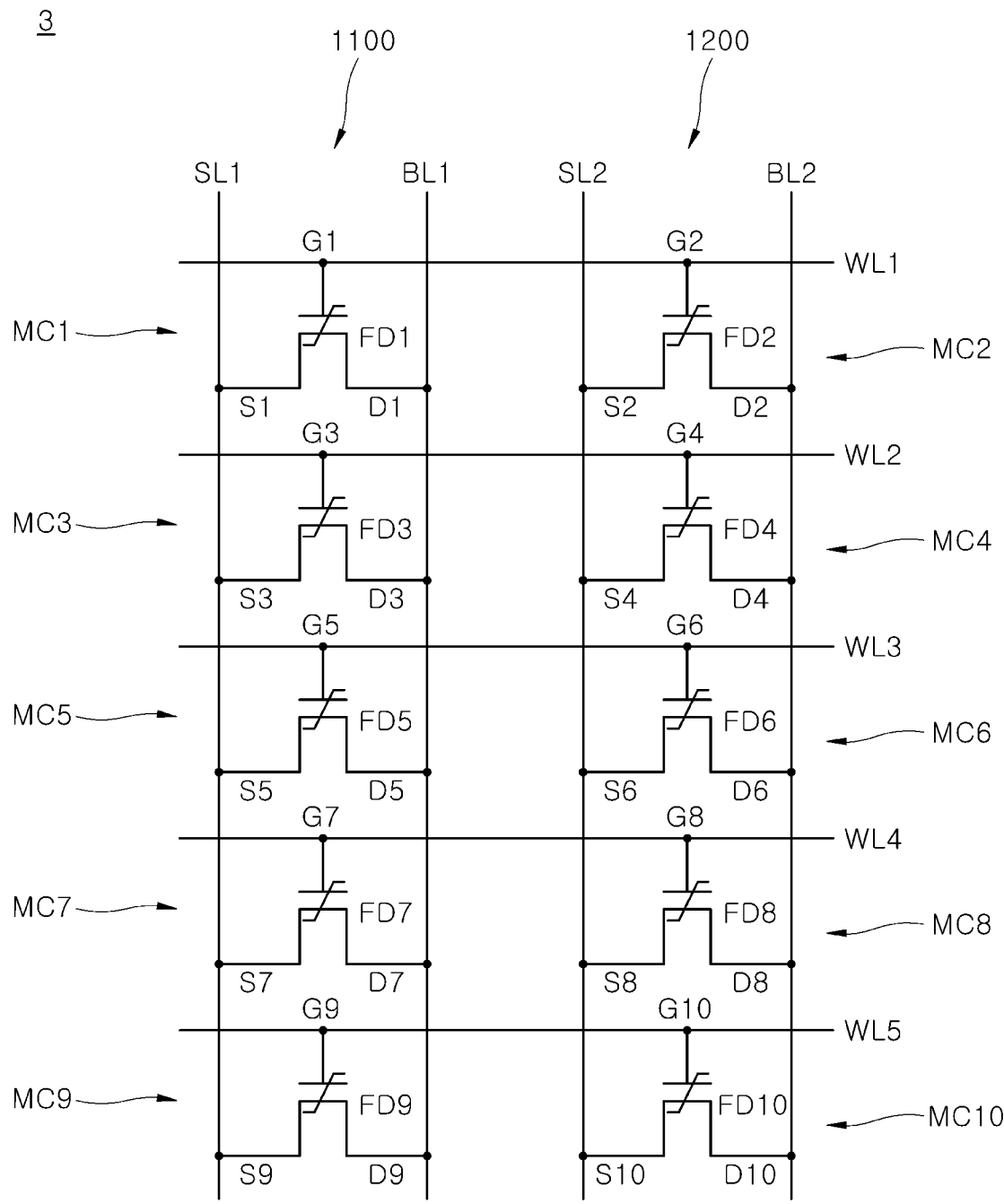
FIG. 6 is a circuit diagram schematically illustrating a ferroelectric memory device according to an embodiment of the present disclosure.

FIG. 6 is a circuit diagram schematically illustrating a ferroelectric memory device 3 according to an embodiment of the present disclosure. Referring to FIG. 6, the ferroelectric memory device 3 may include first and second source lines SL1 and SL2 and first and second bit lines BL1 and BL2 that extend in a first direction, and first through fifth word lines WL1, WL2, WL3, WL4 and WL5 extending in a second direction. As an example, the first direction and the second direction may be perpendicular or at angles to each other.

Although FIG. 6 illustrates two source lines SL1 and SL2, two bit lines BL1 and BL2, and five word lines WL1, WL2, WL3, WL4 and WL5, embodiments of the present disclosure are not necessarily limited thereto and various different numbers of source lines, bit lines and word lines are contemplated.

In FIG. 6, first through tenth ferroelectric memory cell transistors MC1, MC2, MC3, . . . , MC8, MC9, MC10 are disclosed. The first ferroelectric memory cell transistor MC1 may be connected to the first source line SL1 through a first source region S1, and may be connected to the first bit line BL1 through a first drain region D1. The first ferroelectric memory cell transistor MC1 may be connected to the first word line WL1 through a first gate electrode layer G1. The first ferroelectric memory cell transistor MC1 may include a first ferroelectric layer FD1 for storing signal information. In the same manner, the third, fifth, seventh and ninth ferroelectric memory cell transistors MC3, MC5, MC7 and MC9 may be connected to the first source line SL1 through third, fifth, seventh and ninth source regions S3, S5, S7 and S9, respectively, and may be connected to the first bit line BL1 through third, fifth, seventh and ninth drain regions D3, D5, D7 and D9, respectively. The third, fifth, seventh and ninth ferroelectric memory cell transistors MC3, MC5, MC7 and MC9 may be connected to the second to fifth word lines WL2, WL3, WL4 and WL5, respectively through third, fifth, seventh and ninth gate electrode layers G3, G5, G7 and G9, respectively. The third, fifth, seventh and ninth ferroelectric memory cell transistors MC3, MC5, MC7 and MC9 may include third, fifth, seventh and ninth ferroelectric layers FD3, FD5, FD7 and FD9, respectively, for storing signal information.

The second ferroelectric memory cell transistor MC2 may be connected to the second source line SL2 through a second source region S2, and may be connected to the second bit line BL2 through a second drain region D2. The second ferroelectric memory cell transistor MC2 may be connected to the first word line WL1 through a second gate electrode layer G2. The second ferroelectric memory cell transistor MC2 may include a second ferroelectric layer FD2 for storing signal information. In the same way, the fourth, sixth, eighth and tenth ferroelectric memory cell transistors MC4, MC6, MC8 and MC10 may be connected to the second source line SL2 through fourth, sixth, eighth and tenth source regions S4, S6, S8 and S10, respectively and may be connected to the second bit line BL2 through fourth, sixth, eighth and tenth drain regions D4, D6, D8 and D10, respectively. The fourth, sixth, eighth and tenth ferroelectric memory cell transistors MC4, MC6, MC8 and MC10 may be connected to the second to fifth word lines WL2, WL3, WL4 and WL5, respectively through fourth, sixth, eighth and tenth gate electrode layers G4, G6, G8 and G10, respectively. The fourth, sixth, eighth and tenth ferroelectric memory cell transistors MC4, MC6, MC8 and MC10 may include fourth, sixth, eighth and tenth ferroelectric layers FD4, FD6, FD8 and FD10, respectively, for storing signal information.

According to an embodiment, the ferroelectric memory device 3 may include an NMOS type transistor array 1100 connected to the first source line SL1 and the first bit line BL1 and a PMOS type transistor array 1200 connected to the second source line SL2 and the second bit line BL2. More specifically, the first, third, fifth, seventh and ninth ferroelectric memory cell transistors MC1, MC3, MC5, MC7 and MC9 may be NMOS type transistors. On the other hand, the second, fourth, sixth, eighth and tenth ferroelectric memory cell transistors MC2, MC4, MC6, MC8 and MC10 may be PMOS type transistors. Meanwhile, the first, third, fifth, seventh and ninth ferroelectric memory cell transistors MC1, MC3, MC5, MC7 and MC9, which are NMOS transistors, may have the same configurations as the first ferroelectric memory cell transistor 50 described above and with reference to FIG. 5. The second, fourth, sixth, eighth and tenth ferroelectric memory cell transistors MC2, MC4, MC6, MC8 and MC10, which are PMOS transistors, may have the same configurations as the second ferroelectric memory cell transistor 60 described above and with reference to FIG. 5.

The first and second gate electrode layers G1 and G2 of the first and second ferroelectric memory cell transistors MC1 and MC2 may be connected to each other through the first word line WL1. When the first and second remanent polarizations, having opposite polarization orientations, are stored in the first and second ferroelectric memory cell transistors MC1 and MC2, respectively, electrons and holes induced respectively in the first and second gate electrode layers G1 and G2 can be compensated for through the first word line WL1. At this time, the first and second remanent polarizations, having opposite polarization orientations, may be recorded as the same signal information in both the first and second ferroelectric memory transistors MC1 and MC2.

Similarly, the third and fourth gate electrode layers G3 and G4 of the third and fourth ferroelectric memory cell transistors MC3 and MC4 may be connected to each other through the second word line WL2. When the first and second remanent polarizations, having opposite polarization orientations, are stored in the third and fourth ferroelectric memory cell transistors MC3 and MC4 respectively, electrons and holes induced respectively in the third and fourth gate electrode layers G3 and G4 can be compensated for through the second word line WL2. At this time, the first and second remanent polarization, having opposite polarization orientations, may be recorded as the same signal information in both the first and second ferroelectric memory transistors MC3 and MC4.

In the same manner, the gate electrode layers of the fifth and sixth ferroelectric memory cell transistors MC5 and MC6, seventh and eighth ferroelectric memory cell transistors MC7 and MC8, and ninth and tenth ferroelectric memory cell transistors MC9 and MC10 may be connected to each other through the third, fourth and fifth word lines WL3, WL4 and WL5, respectively. Through these connections, electrons and holes induced in each gate electrode layer can be compensated for through the connecting word lines.

A method of writing signal information of '1' and '0' to the NMOS type first ferroelectric memory cell transistor MC1 will be described with reference to FIGS. 5 and 6 and Table 1, as an embodiment. At this time, the signal information '1' may correspond to a remanent polarization that induces electrons in the channel region, and the signal information '0' may correspond to a remanent polarization tends to cause ejection of electrons from the channel region.

TABLE 1

| Writing Signal 1 (MC1) | | Writing Signal 0 (MC1) | |
|---|---|---|---|
| Signal Line | Applied Voltage | Signal Line | Applied Voltage |
| SL1 | Grounded | SL1 | $V_{h\text{-}3}$ |
| BL1 | Grounded | BL1 | $V_{h\text{-}3}$ |
| First Well | Grounded | First Well | $V_{h\text{-}3}$ |
| SL2 | $V_{h\text{-}1}$ | SL2 | Grounded |
| BL2 | $V_{h\text{-}1}$ | BL2 | Grounded |
| Second Well | $V_{h\text{-}1}$ | Second Well | Grounded |
| WL1 | $V_{pg\text{-}1}$ | WL1 | $V_{pg\text{-}2}$ |
| WL2~WL5 | $V_{h\text{-}2}$ | WL2~WL5 | $V_{h\text{-}4}$ |

Referring to FIG. 6 and Table 1, the writing operation of signal information '1' into the first ferroelectric memory cell transistor MC1 may be performed by applying voltages as follows. The first source line SL1, the first bit line BL1 and the first well may be grounded and a first holding voltage $V_{h\text{-}1}$ having a positive polarity may be applied to the second source line SL2, the second bit line BL2 and the second well. Then, a first program voltage $V_{pg\text{-}1}$ having a positive polarity may be applied through the first word line WL1. A second holding voltage $V_{h\text{-}2}$ having a half (½) magnitude of the first holding voltage $V_{h\text{-}1}$ may be applied to the second to fifth word lines WL2~WL5. At this time, the magnitudes of the first program voltage $V_{pg\text{-}1}$ and the first holding voltage $V_{h\text{-}1}$ may be the same. Accordingly, the first program voltage $V_{pg\text{-}1}$ having a positive polarity may form a remanent polarization of the first polarization orientation $P_{dn}$ in a ferroelectric layer of the first ferroelectric memory cell transistor MC1. The magnitude of the second holding voltage $V_{h\text{-}2}$ applied to the second through fifth word lines WL2~WL5 may not great enough to cause polarization switching in the ferroelectric layers of the third through tenth ferroelectric memory cell transistors MC3, MC4, MC5, . . . , MC8, MC9 and MC10.

Meanwhile, the writing operation of signal information '0' into the first ferroelectric memory cell transistor MC1 may be performed by applying voltages as follows. A third holding voltage $V_{h\text{-}3}$ equal to the first program voltage $V_{pg\text{-}1}$ may be applied to the first source line SL1, the first bit line BL1 and the first well. The second source line SL2, the second bit line BL2 and the second well may be grounded. Then, a second program voltage $V_{pg\text{-}2}$ of 0 V may be applied through the first word line WL1. A fourth holding voltage $V_{h\text{-}4}$ having a half (½) magnitude of the third holding voltage $V_{h\text{-}3}$ may be applied to the second through fifth word lines WL2~WL5. Accordingly, the second program voltage $V_{pg\text{-}2}$ may form a remanent polarization of the second polarization orientation $P_{up}$ in the ferroelectric layer of the first ferroelectric memory cell transistor MC1. The magnitude of the fourth holding voltage $V_{h\text{-}4}$ applied to the second through fifth word lines WL2~WL5 may not great enough to cause polarization switching in the ferroelectric layers of the third through tenth ferroelectric memory cell transistors MC3, MC4, MC5, . . . , MC8, MC9 and MC10.

In another embodiment, a method of writing signal information of '1' and '0' in the PMOS type second ferroelectric memory cell transistor MC2 will be described with reference to FIGS. 5 and 6 and Table 2. At this time, the signal information '1' may correspond to a remanent polarization that induces holes in the channel region, and the signal information '0' may correspond to a remanent polarization that contributes to ejection of holes from the channel region.

TABLE 2

| Writing Signal 1 (MC2) | | Writing Signal 0 (MC2) | |
|---|---|---|---|
| Signal Line | Applied Voltage | Signal Line | Applied Voltage |
| SL1 | Grounded | SL1 | $V_{h\text{-}7}$ |
| BL1 | Grounded | BL1 | $V_{h\text{-}7}$ |
| First Well | Grounded | First Well | $V_{h\text{-}7}$ |
| SL2 | $V_{h\text{-}5}$ | SL2 | Grounded |
| BL2 | $V_{h\text{-}5}$ | BL2 | Grounded |
| Second Well | $V_{h\text{-}5}$ | Second Well | Grounded |
| WL1 | $V_{pg\text{-}3}$ | WL1 | $V_{pg\text{-}4}$ |
| WL2~WL5 | $V_{h\text{-}6}$ | WL2~WL5 | $V_{h\text{-}8}$ |

Referring to FIG. 6 and Table 2, the writing operation of signal information '1' into the second ferroelectric memory cell transistor MC2 may be performed by applying voltages as follows. The first source line SL1, the first bit line BL1 and the first well may be grounded, and a fifth holding voltage $V_{h\text{-}5}$ having a positive polarity equal to the first holding voltage $V_{h\text{-}1}$ may be applied to the second source line SL2, the second bit line BL2 and the second well. Then, a third program voltage $V_{pg\text{-}3}$ of 0 V may be applied through the first word line WL1. A sixth holding voltage $V_{h\text{-}6}$ equal to the second holding voltage $V_{h\text{-}2}$ may be applied to the second through fifth word lines WL2~WL5. Accordingly, the third program voltage $V_{pg\text{-}3}$ may form a remanent polarization of the second polarization orientation $P_{up}$ in a ferroelectric layer of the second ferroelectric memory cell transistor MC2. The magnitude of the sixth holding voltage $V_{h\text{-}6}$ applied to the second through fifth word lines WL2~WL5 may not great enough to cause polarization switching in the ferroelectric layers of the third through tenth ferroelectric memory cell transistors MC3, MC4, MC5, . . . , MC8, MC9 and MC10.

Meanwhile, the writing operation of signal information '0' into the second ferroelectric memory cell transistor MC2 may be performed by applying voltages as follows. A seventh holding voltage $V_{h\text{-}7}$ equal to the third holding voltage $V_{h\text{-}3}$ may be applied to the first source line SL1, the first bit line BL1 and the first well. The second source line SL2, the second bit line BL2 and the second well may be grounded. Then, a fourth program voltage $V_{pg-4}$ equal to the second program voltage $V_{pg-2}$ may be applied through the first word line WL1. An eighth holding voltage $V_{h-8}$ equal to the fourth holding voltage $V_{h-4}$ may be applied to the second through fifth word lines WL2~WL5. Accordingly, the fourth program voltage $V_{pg-4}$ having a positive polarity may form a remanent polarization of the first polarization orientation $P_{dn}$ in the ferroelectric layer of the second ferroelectric memory cell transistor MC2. The magnitude of the eighth holding voltage $V_{h-8}$ applied to the second through fifth word lines WL2~WL5 may not great enough to cause polarization switching in the ferroelectric layers of the third through tenth ferroelectric memory cell transistors MC3, MC4, MC5, . . . , MC8, MC9 and MC10.

The above-described operation methods illustrate operations of ferroelectric memory devices of the present disclosure. It will be understood that various modifications can be made with respect to the magnitudes and polarities of the first through fourth program voltages $V_{pg-1}$, $V_{pg-2}$, $V_{pg-3}$ and $V_{pg-4}$ and the first through eighth holding voltages $V_{h-1}$, $V_{h-2}$, $V_{h-3}$, . . . , $V_{h-6}$, $V_{h-7}$, $V_{h-8}$ and the like.

Figure 7:
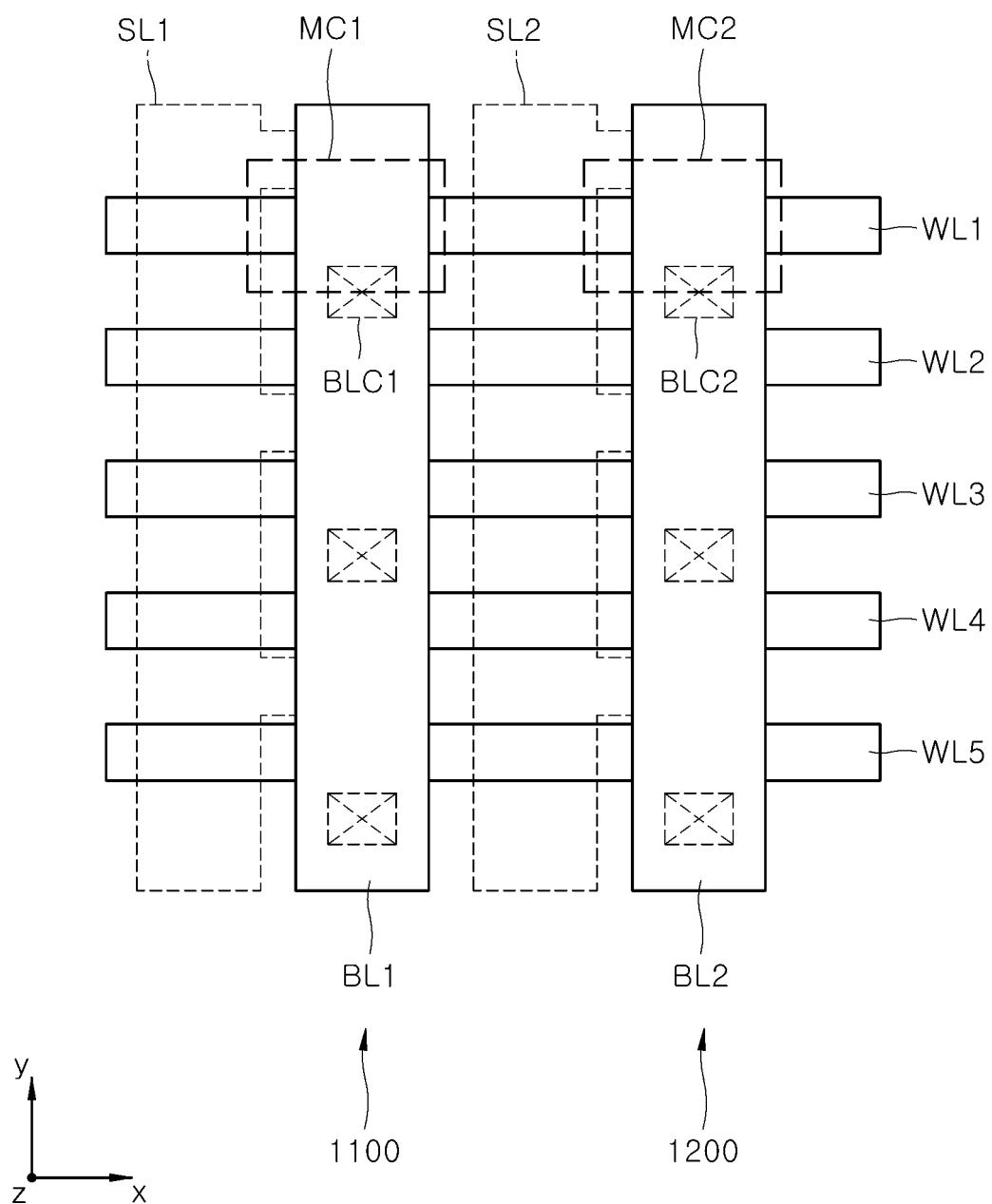
FIG. 7 is a layout diagram schematically illustrating a ferroelectric memory device according to an embodiment of the present disclosure.
Figure 8A:
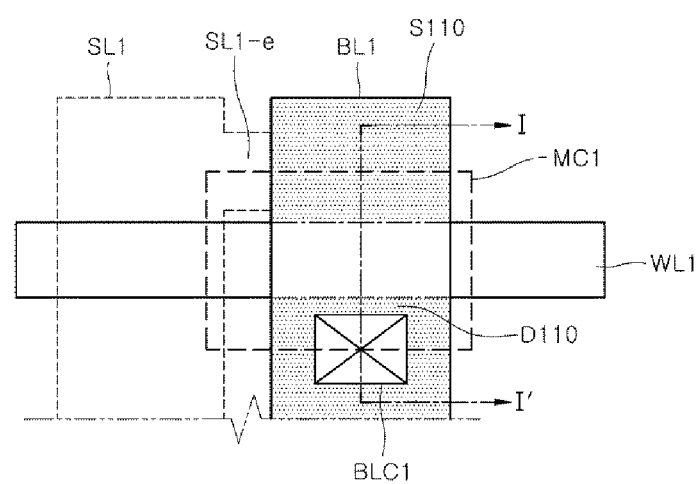
FIG. 8A is a layout diagram illustrating a unit cell MC1 of an NMOS type ferroelectric memory cell transistor in the ferroelectric memory device of FIG. 7.
Figure 8B:
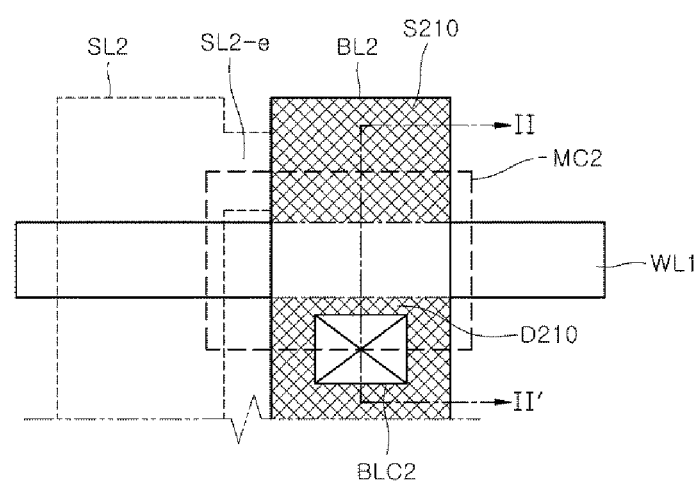
FIG. 8B is a layout diagram illustrating a unit cell MC2 of an PMOS type ferroelectric memory cell transistor in the ferroelectric memory device of FIG. 7.
Figure 9A:
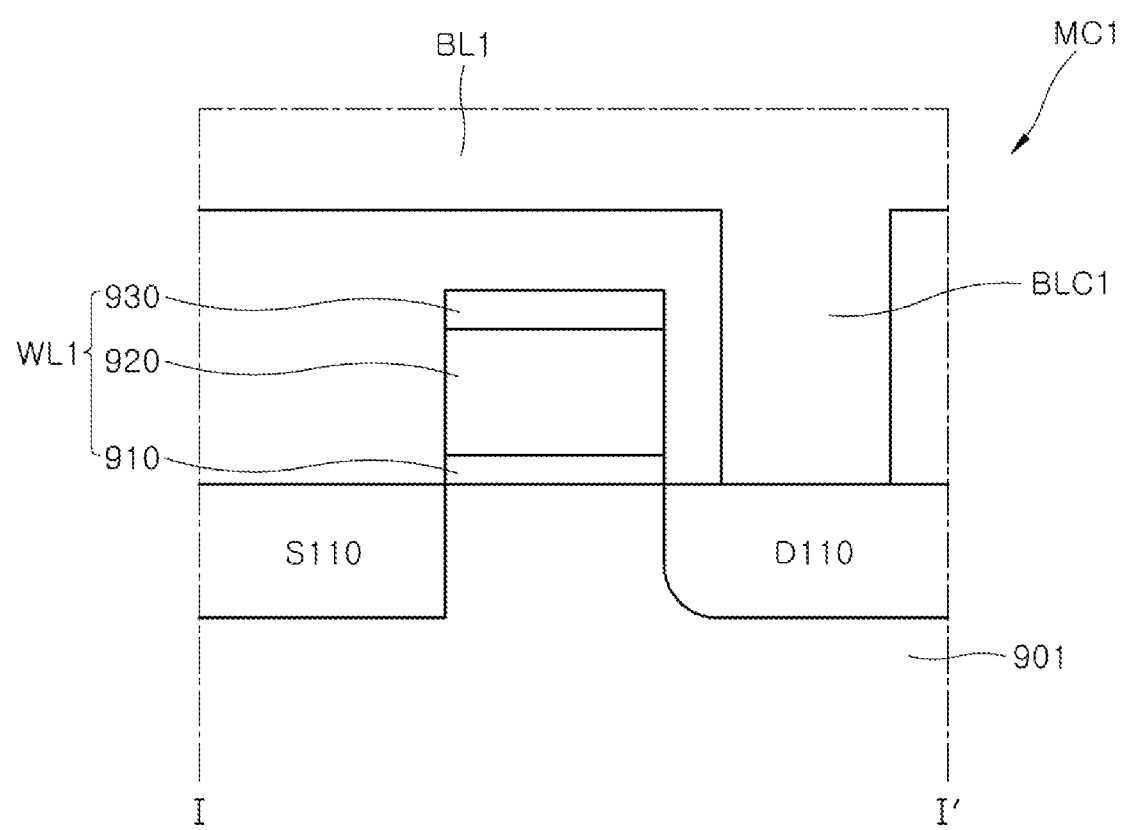
FIG. 9A is a cross-sectional view of the unit cell MC1 of FIG. 8A taken along line I-I'.

FIG. 7 is a layout diagram schematically illustrating a ferroelectric memory device according to an embodiment of the present disclosure. FIG. 8A is a layout diagram illustrating a unit cell MC1 of an NMOS type ferroelectric memory cell transistor in the ferroelectric memory device of FIG. 7, and FIG. 8B is a layout diagram illustrating a unit cell MC2 of an PMOS type ferroelectric memory cell transistor in the ferroelectric memory device of FIG. 7. FIG. 9A is a cross-sectional view of the unit cell MC1 taken along line I-I' of FIG. 8A and FIG. 9B is a cross-sectional view of the unit cell MC2 taken along line II-II' of FIG. 8B.

In an embodiment, the layout diagrams of FIGS. 7, 8A and 8B may be layout diagrams of the ferroelectric memory device 3 of FIG. 6. Referring to FIGS. 7, 8A and 8B, first and second source lines SL1 and SL2, and first and second bit lines BL1 and BL2 may extend along a first direction, for example, a y-direction. First through fifth word lines WL1, WL2, WL3, WL4 and WL5 may extend along a different second direction, for example, an x-direction. At this time, a ferroelectric memory cell transistor MC1 in an NMOS type transistor array 1100 connected to the first source line SL1 and the first bit line BL1 may be an NMOS transistor. In addition, a ferroelectric memory cell transistor MC2 in a PMOS type transistor array 1200 connected to the second source line SL2 and the second bit line BL2 may be a PMOS transistor. FIGS. 8A and 9A illustrate a first ferroelectric memory cell transistor MC1 as an example of a transistor in the NMOS transistor array 1100. FIGS. 8B and 9B illustrate a second ferroelectric memory cell transistor MC2 as an example of a transistor in the PMOS transistor array 1200.

Referring to FIGS. 8A and 9A, the first ferroelectric memory cell transistor MC1 may have a first source region S110 doped into an n-type region and a first drain region D110 doped into an n-type region. Both first source region S110 and first drain region D110 may be disposed in a first well 901 doped into p-type. The first source region S110 may be connected to a first source line connection portion SL1-e, which is formed by extending a portion of the first source line SL1 in the second direction. The first drain region D110 may be connected to the first bit line BL1 by a first bit line contact BLC1. The first word line WL1 extending in the second direction may be disposed between the first source region S110 and the first drain region D110. The first word line WL1 may include an interfacial insulation layer 910, a ferroelectric layer 920 and a gate electrode layer 930 that are sequentially disposed on the first well 901. Configurations of the interfacial insulation layer 910, ferroelectric layer 920 and gate electrode layer 930 may be substantially the same as those of the interfacial insulation layer 510, the ferroelectric layer 520 and the gate electrode layer 530 of the first ferroelectric memory cell transistor described above and with reference to FIG. 5.

Figure 9B:
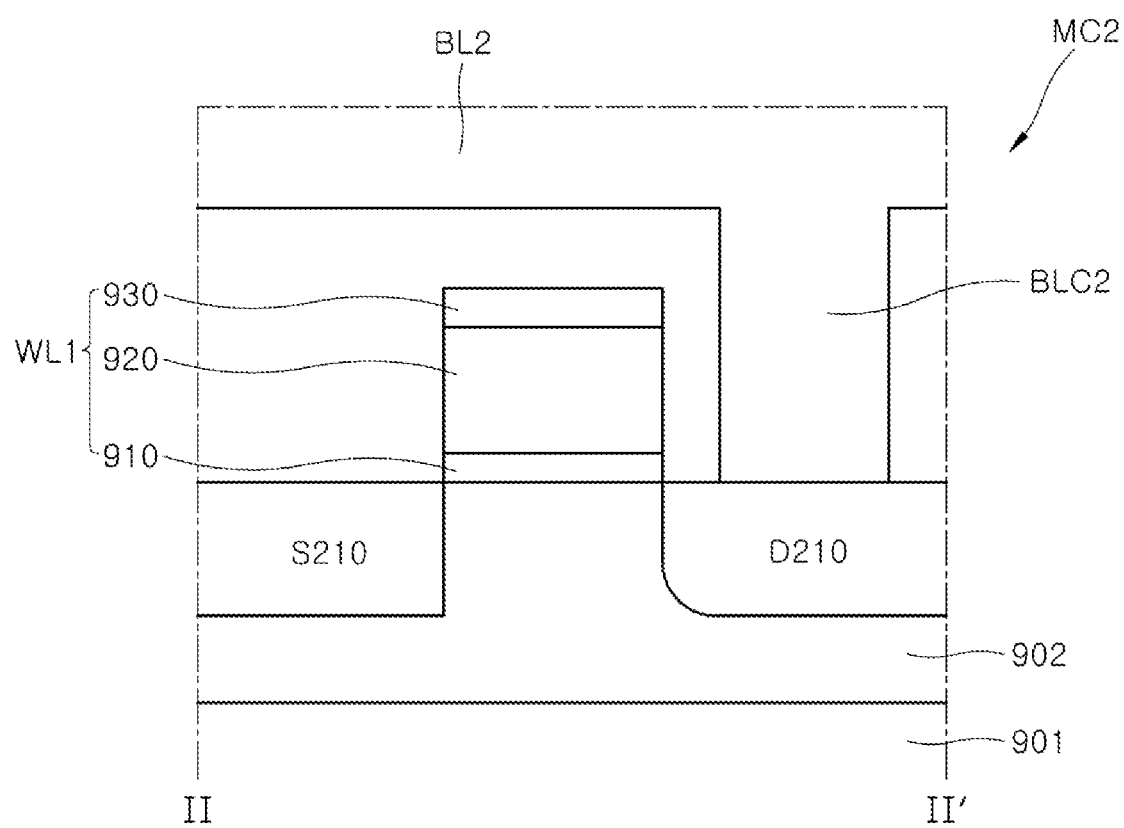
FIG. 9B is a cross-sectional view of the unit cell MC2 of FIG. 8B taken along line II-II'.

Referring to FIGS. 8B and 9B, the second ferroelectric memory cell transistor MC2 may have a second source region S210 doped into p-type and a second drain region D210 doped into p-type. Both second source region S210 and second drain region D210 may be disposed in a second well 902 doped into n-type. In an embodiment, the second well 902 may be disposed in the semiconductor substrate 901 that is also doped into p-type, that is, in the first well 901. The second source region S2 may be connected to a second source line connection portion SL2-e, which is formed by extending a portion of the second source line SL2 in the second direction. The second drain region D210 may be connected to the second bit line BL2 by a second bit line contact BLC2. The first word line WL1 extending in the second direction may be disposed between the second source region S210 and the second drain region D210. Referring to FIG. 9B, the first word line WL1 may include the interfacial insulation layer 910, the ferroelectric layer 920 and the gate electrode layer 930, which are sequentially disposed on the second well 902. As illustrated in FIG. 7, the first and second ferroelectric memory cell transistors MC1 and MC2 may share the first word line WL1.

As described above, in ferroelectric memory devices according to embodiments of the present disclosure, a first ferroelectric memory cell transistor of NMOS type and a second ferroelectric memory cell transistor of PMOS type may be disposed adjacent to each other, and the gate electrode layers of the first and second ferroelectric memory cell transistors may be electrically connected to each other through a word line.

Meanwhile, the first and second ferroelectric memory cell transistors may respectively store remanent polarization in ferroelectric layers with different polarization orientations but corresponding to the same signal information. Different types of charges can be induced in the channel layers and the gate electrode layers contacting the ferroelectric layer based on the different polarization orientations. The different types of charges may be moved and compensated for through word lines, so that charges can be prevented from pinning in each ferroelectric layer. Thus, the reliability of the polarization switching operation with respect to the ferroelectric layer can be prevented from being degraded by charge pinning.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:
1. A ferroelectric memory device comprising:
a semiconductor substrate;
a first ferroelectric memory cell transistor of NMOS type, disposed in a first region of the semiconductor substrate and comprising a first ferroelectric layer and a first gate electrode layer that is disposed on the first ferroelectric layer; and
a second ferroelectric memory cell transistor of PMOS type, disposed in a second region adjacent to the first region of the semiconductor substrate and comprising a second ferroelectric layer and a second gate electrode layer that is disposed on the second ferroelectric layer; and a conduction line electrically connecting the first gate electrode layer and the second gate electrode layer, wherein the first ferroelectric layer is controlled to store a remanent polarization having a first polarization orientation and the second ferroelectric layer is controlled to store a remanent polarization having a second polarization orientation opposite to the first polarization orientation.

2. The ferroelectric memory device of claim 1, wherein the first and second ferroelectric memory cell transistors are controlled to store the same signal information.

3. The ferroelectric memory device of claim 1, wherein the first region comprises:

a first well doped into p-type; and a first source region and a first drain region that are disposed in the first well to be spaced apart from each other and doped into n-type, and wherein the second region comprises:

a second well doped into n-type; and a second source region and a second drain region that are disposed in the second well to be spaced apart from each other and doped into p-type.

4. The ferroelectric memory device of claim 3, further comprising:

a first source line electrically connected to the first source region;

a first bit line electrically connected to the first drain region;

a second source line electrically connected to the second source region; and a second bit line electrically connected to the second drain region, and wherein the first and second gate electrode layers are electrically connected to each other through a word line.

5. The ferroelectric memory device of claim 1, wherein the first ferroelectric memory cell transistor comprises a first ferroelectric layer disposed on a first well doped into p-type, the second ferroelectric memory cell transistor comprises a second ferroelectric layer disposed on a second well doped into n-type, the first gate electrode layer is disposed on the first ferroelectric layer, and the second gate electrode layer is disposed on the second ferroelectric layer.

6. The ferroelectric memory device of claim 5, further comprising:

a first interfacial insulation layer disposed between the first well and the first ferroelectric layer; and a second interfacial insulation layer disposed between the second well and the second ferroelectric layer.

7. The ferroelectric memory device of claim 5, wherein each of the first and second ferroelectric layers comprises at least one of hafnium oxide (HfO2), zirconium oxide (ZrO2), and hafnium zirconium oxide (Hf0.5Zr0.5O2).

8. The ferroelectric memory device of claim 5, wherein each of the first and second ferroelectric layers comprises at least one selected from the group consisting of carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), gadolinium (Gd) and lanthanum (La) as a dopant.

9. The ferroelectric memory device of claim 5, wherein each of the first and second gate electrode layers comprises at least one selected from the group consisting of tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, and ruthenium oxide.

10. A ferroelectric memory device comprising:

a first ferroelectric memory cell transistor of NMOS type connected to a first bit line and a first source line; and a second ferroelectric memory cell transistor of PMOS type, connected to a second bit line and a second source line and disposed adjacent to the first ferroelectric memory cell transistor; and a word line electrically connecting the first and second ferroelectric memory cell transistors with each other, wherein the first and second ferroelectric memory cell transistors are controlled to store remanent polarizations having different polarization orientation with each other.

11. The ferroelectric memory device of claim 10, wherein the first and second ferroelectric memory cell transistors are controlled to store the same signal information.

12. The ferroelectric memory device of claim 10, wherein the first and second source lines, and the first and second bit lines extend in a first direction, and the word line extends in a second direction perpendicular to the first direction.

13. The ferroelectric memory device of claim 10, wherein the first ferroelectric memory cell transistor comprises:

a semiconductor substrate having a first well doped into p-type;

a first ferroelectric layer and a first gate electrode layer that are sequentially disposed on the first well; and a first source region and a first drain region that are doped into n-type and disposed in regions of the semiconductor substrate at opposite ends of the first gate electrode layer, and wherein the second ferroelectric memory cell transistor comprises:

a second well doped into p-type and disposed adjacent to the first well;

a second ferroelectric layer and a second gate electrode layer that are sequentially disposed on the second well; and a second source region and a second drain region that are doped into p-type and disposed in regions of the semiconductor substrate at opposite ends of the second gate electrode layer.

14. The ferroelectric memory device of claim 13, wherein each of the first and second ferroelectric layers comprises at least one of hafnium oxide (HfO2), zirconium oxide (ZrO2), and hafnium zirconium oxide (Hf0.5Zr0.5O2).

15. The ferroelectric memory device of claim 14, wherein each of the first and second ferroelectric layers comprises at least one selected from the group consisting of carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), gadolinium (Gd) and lanthanum (La) as a dopant.

16. The ferroelectric memory device of claim 13,
wherein the first and second gate electrode layers comprises at least one selected from the group consisting of tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, and ruthenium oxide.

17. The ferroelectric memory device of claim 13,
further comprising:
a first interfacial insulation layer disposed between the first well and the first ferroelectric layer; and
a second interfacial insulation layer disposed between the second well and the second ferroelectric layer.

18. The ferroelectric memory device of claim 17,
wherein the semiconductor substrate is a silicon (Si) substrate, and
each of the first and second interfacial insulation layers comprise at least one of silicon oxide, silicon nitride and silicon oxynitride.

* * * * *